(12) United States Patent
Iwasaki et al.

(10) Patent No.: US 7,358,578 B2
(45) Date of Patent: Apr. 15, 2008

(54) FIELD EFFECT TRANSISTOR ON A SUBSTRATE WITH (111) ORIENTATION HAVING ZIRCONIUM OXIDE GATE INSULATION AND COBALT OR NICKEL SILICIDE WIRING

(75) Inventors: Tomio Iwasaki, Tsukuba (JP); Hiroshi Moriya, Koshigaya (JP); Hideo Miura, Koshigaya (JP); Shuji Ikeda, Koganei (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 10/155,833

(22) Filed: May 22, 2002

(65) Prior Publication Data

US 2003/0030117 A1    Feb. 13, 2003

(30) Foreign Application Priority Data

May 22, 2001    (JP)    .............................. 2001-151980
Dec. 7, 2001    (JP)    .............................. 2001-373531

(51) Int. Cl.
  *H01L 29/76*    (2006.01)
  *H01L 29/94*    (2006.01)
  *H01L 31/00*    (2006.01)
(52) U.S. Cl. ................. 257/411; 257/412; 257/E21.625
(58) Field of Classification Search ........ 257/410–412, 257/213, 347
  See application file for complete search history.

(56) References Cited

U.S. PATENT DOCUMENTS 4,707,197 A * 11/1987 Hensel et al. ............... 117/105

(Continued)

FOREIGN PATENT DOCUMENTS

JP    53-113484 A    10/1978

(Continued)

OTHER PUBLICATIONS

Lee et al. "Ultrathin Hafnium Oxide with Low Leakage and Excellent Reliability for Alternative Gate Dielectric Application," IEEE International Electron Devices Meeting 1999, presentation 6.1 pp. 133-136, presentation 6.4 pp. 145-148 (1999).

(Continued)

*Primary Examiner*—Evan Pert
*Assistant Examiner*—Ben P Sandvik
(74) *Attorney, Agent, or Firm*—Townsend and Townsend and Crew LLP

(57) ABSTRACT

Diffusion layers 2-5 are formed on a silicon substrate 1, and gate dielectric films 6, 7 and gate electrodes 8, 9 are formed on these diffusion layers 2-5 so as to be MOS transistors. Zirconium oxide or hafnium oxide is used as a major component of gate dielectric films 6, 7. Gate dielectric films 6, 7 are formed, for example, by CVD. As substrate 1, there is used one of which the surface is (111) crystal face so as to prevent diffusion of oxygen into silicon substrate 1 or gate electrodes 8, 9. In case of using a substrate of which the surface is (111) crystal face, diffusion coefficient of oxygen is less than $frax;1;100$ of the case in which a silicon substrate of which the surface is (001) crystal face is used, and oxygen diffusion is controlled. Thus, oxygen diffusion is controlled, generation of leakage current is prevented and properties are improved. There is realized a semiconductor device having high reliability and capable of preventing deterioration of characteristics concomitant to miniaturization.

8 Claims, 13 Drawing Sheets

U.S. PATENT DOCUMENTS

| | | | |
|---|---|---|---|
| 5,684,302 A * | 11/1997 | Wersing et al. | |
| 5,728,625 A | 3/1998 | Tung | |
| 5,810,923 A | 9/1998 | Yano et al. | |
| 5,828,080 A * | 10/1998 | Yano et al. | 257/43 |
| 6,060,755 A | 5/2000 | Ma et al. | |
| 6,184,114 B1 | 2/2001 | Lukanc | |
| 6,358,866 B1 * | 3/2002 | Stesmans et al. | |
| 6,376,888 B1 | 4/2002 | Tsunashima et al. | |
| 6,420,784 B2 * | 7/2002 | Hu et al. | |
| 6,465,853 B1 * | 10/2002 | Hobbs et al. | |
| 6,489,648 B2 | 12/2002 | Iwasaki et al. | |
| 6,507,469 B2 * | 1/2003 | Andoh | |
| 6,514,828 B2 | 2/2003 | Ahn et al. | |
| 6,686,274 B1 | 2/2004 | Shimazu et al. | |
| 6,696,735 B2 * | 2/2004 | Fului | |
| 6,770,500 B2 * | 8/2004 | Callegari et al. | |
| 6,794,315 B1 * | 9/2004 | Klemperer et al. | |
| 2001/0018254 A1 | 8/2001 | Yamamoto | |
| 2002/0048910 A1 | 4/2002 | Taylor et al. | |
| 2002/0086548 A1 | 7/2002 | Chang | |
| 2002/0173130 A1 | 11/2002 | Pomerede et al. | |
| 2004/0217432 A1 * | 11/2004 | Iwasaki et al. | |

FOREIGN PATENT DOCUMENTS

| | | |
|---|---|---|
| JP | 05-315286 | 11/1993 |
| JP | 08-078357 | 3/1996 |
| JP | 09-055486 A | 2/1997 |
| JP | 09-115860 | 5/1997 |
| JP | 2000-022139 | 1/2000 |
| JP | 2000-243951 A | 9/2000 |

OTHER PUBLICATIONS

LSI Device Solutions in Nikkei Microdevices Feb. 2000, pp. 93:106.

Decelis et al. "Molecular Dynamics Dimulation of Crack Tip Processes in Alpha-iron and Copper," J. Appl. Phys. 54(9):4864-4878 (Sep. 1983).

Kwok et al. "Molecular-dynamics Studies of Grain-boundary Diffusion," Physical Review B 29(10):5363-5371 (May 1984).

Qi et al. "MOSCAP and MOSFET Characteristics Using $ZrO_2$ Gate Dielectric Deposited Directly on Si," Lecture No. 6.4 pp. 145-148, 1999 IEEE, The Institute of Electrical and Electronics Engineers, International Electron Devices Meeting (Sep. 1999).

Periodic Table of Elements with entry on Hafnium from Los Alamos National Laboratory http://www.lanl.gov (Dec. 2003).

*Hackh's Chemical Dictionary 4th Edition*, Julius Grant ed., McGraw-Hill, p. 431 (received in USPTO Aug. 1982).

* cited by examiner

FIELD EFFECT TRANSISTOR ON A SUBSTRATE WITH (111) ORIENTATION HAVING ZIRCONIUM OXIDE GATE INSULATION AND COBALT OR NICKEL SILICIDE WIRING

BACKGROUND OF THE INVENTION

The present invention relates to a semiconductor device using a high dielectric constant material.

With miniaturization of semiconductor devices in recent years, it is required that the gate length in transistors be reduced to 0.15 μm and the gate dielectric film thickness to not more than 2 nm when $SiO_2$ is used for such an insulating film. Slimming of the insulating film to a thickness of not more than 2 nm enlarges tunnel current to an unignorable degree.

As a solution to this problem, it has been proposed to use an insulating material with a higher dielectric constant than $SiO_2$ so as to increase the physical film thickness while maintaining the desirable dielectric properties. Among the candidates for the high dielectric constant materials having potentialities to satisfy the above requirements are zirconium oxide and hafnium oxide as described in the February, 2000, issue of NIKKEI MICRODEVICES (pages 93-106).

SUMMARY OF THE INVENTION

Zirconium oxide and hafnium oxide, however, form a reaction compound with a film thickness of about 1.5 to 2.5 nm at the interface with a silicon substrate as described in, for instance, papers presented in 1999 IEEE (The Institute of Electrical and Electronics Engineers) International Electron Devices Meeting (Presentation No. 6.1 on pages 133-136, and Presentation No. 6.4 on pages 145-148).

This reaction compound is formed as oxygen gets away from zirconium oxide or hafnium oxide and is diffused into the silicon substrate, so formation of such a reaction compound indicates the occurrence of oxygen deficiency in zirconium oxide or hafnium oxide. This oxygen deficiency is causative of the detrimental phenomena for the properties of semiconductor devices, such as increase of leakage current.

Also, oxygen may be diffused from the gate dielectric films mostly composed of zirconium oxide or hafnium oxide to the gate electrodes to induce oxygen deficiency. This, too, is causative of property deterioration of semiconductor devices.

The above-mentioned problems relating to the reaction compound from zirconium oxide or hafnium oxide and silicon substrate also exist in semiconductor devices having a thin film transistor (TFT) structure.

Thus, the reaction compound from polycrystalline silicon film and zirconium oxide or hafnium oxide is that formed as oxygen is liberated from zirconium oxide or hafnium oxide and diffused to polycrystalline silicon film, and this means that oxygen deficiency occurs in zirconium oxide or hafnium oxide.

The first object of the present invention is to realize a semiconductor device with high reliability, which is proof against deterioration of dielectric properties concomitant to structural miniaturization.

The second object of the present invention is to realize a miniaturized semiconductor device, which can be produced in high yield.

The third object of the present invention is to realize a semiconductor device having a gate structure resistant to diffusion of oxygen through the interface between silicon substrate and gate dielectric films.

The fourth object of the present invention is to realize a semiconductor device having a thin film transistor structure, which obstructs diffusion of oxygen through the interface between silicon film and gate dielectric films.

As a result of the studies for finding means for reducing diffusion of oxygen from the insulating films mostly composed of zirconium oxide or hafnium oxide, the present inventors have found that it is of avail for the above purpose to use a silicon substrate of which the surface is (111) crystal face instead of such a silicon substrate of which the surface is (001) crystal face as used in the conventional semiconductor devices.

They have also found that incorporation of hafnium or titanium in zirconium oxide, or incorporation of titanium in hafnium oxide, of the insulating film is effective for further suppressing diffusion of oxygen.

They have further found that the electrode materials which resist diffusion of oxygen through the interface with insulating films mostly composed of zirconium oxide or hafnium oxide are cobalt silicide and silicon. In this connection, (100) crystal face and (010) crystal face are equivalent to (001) crystal face.

They have further found that use of polycrystalline silicon film having (111) orientation is effective for semiconductor devices having TFT structure.

In order to attain the above objects, the present invention is embodied as described below. In the present specification and claims, an abbreviation "at. %" is used to represent "atomic %".

(1) A semiconductor device comprising a silicon substrate, gate dielectric films mostly composed of zirconium oxide and formed on a major surface of said silicon substrate, and gate electrode films formed in contact with said gate dielectric films, said major surface of said silicon substrate being parallel to Si (111) crystal face.

(2) Preferably, a semiconductor device described in (1) above, wherein the main constituent of said gate electrode films is cobalt silicide or silicon.

(3) Also preferably, a semiconductor device of (2) above, wherein said gate dielectric films contain hafnium in a concentration of from 0.01 at. % inclusive to 15 at. % inclusive.

(4) Also preferably, a semiconductor device of (2) above, wherein said gate dielectric films contain hafnium in a concentration of from 0.04 at. % inclusive to 12 at. % inclusive.

(5) Also preferably, a semiconductor device of (2) above, wherein said gate dielectric films contain titanium in a concentration of from 0.005 at. % inclusive to 15 at. % inclusive.

(6) Also preferably, a semiconductor device of (2) above, wherein said gate dielectric films contain titanium in a concentration of from 0.02 at. % inclusive to 8 at. % inclusive.

(7) A semiconductor device comprising a silicon substrate, gate dielectric films mostly composed of hafnium oxide and formed on a major surface of said silicon substrate, and gate electrode films formed in contact with said gate dielectric films, said major surface of silicon substrate being parallel to Si (111) crystal face.

(8) Preferably, a semiconductor device of (7) above, wherein said gate electrode films are mostly composed of cobalt silicide or silicon.

(9) Also preferably, a semiconductor device of (8) above, wherein said gate dielectric films contain titanium in a concentration of from 0.01 at. % inclusive to 15 at. % inclusive.

(10) Also preferably, a semiconductor device of (8) above, wherein said gate dielectric films contain titanium in a concentration of from 0.03 at. % inclusive to 10 at. % inclusive.

(11) A semiconductor device comprising a substrate, silicon films formed on a major surface of said substrate, gate dielectric films formed in contact with said silicon films, and gate electrode films formed in contact with said gate dielectric films, said silicon films having (111) orientation, and said gate dielectric films being mostly composed of zirconium oxide.

(12) A semiconductor device comprising a substrate, silicon films formed on a major surface of said substrate, gate dielectric films formed in contact with said silicon films, and gate electrode films formed in contact with said gate dielectric films, said silicon films having (111) orientation, and said gate dielectric films being mostly composed of hafnium oxide.

(13) A semiconductor device comprising a substrate, insulating films formed on a major surface of said substrate, silicon films formed in contact with said insulating films, gate dielectric films formed in contact with said silicon films, and gate electrode films formed in contact with said gate dielectric films, said silicon films having (111) orientation, said insulating films being mostly composed of hafnium oxide or zirconium oxide, and said gate dielectric films being mostly composed of hafnium oxide or zirconium oxide.

With progress of integration and miniaturization of semiconductor devices in recent years, reduction of contact resistance of the section where silicon substrate is connected to metal wiring for high speed operation is required. As prior art for reducing contact resistance, it has been proposed to form a cobalt silicide film on a diffusion layer (source/drain) or polycrystalline silicon electrode on a silicon substrate as described in JP-A-08-78357.

However, as a result of miniaturization of semiconductor devices, the diffusion layer has become shallow, and slimming of the cobalt silicide films becomes necessary. Slimming of the cobalt silicide films has given rise to the problem that due to high-temperature heat treatment in the production steps, for example memory capacitor forming step, cobalt atoms in the cobalt silicide films are diffused into the silicon substrate, reducing the thickness of cobalt silicide film excessively in parts to cause local elevation of resistance. This problem becomes more serious in case of using a high dielectric constant material such as tantalum oxide for the capacitor insulating film for higher integration of memory capacitor.

This is for the reason that in case a high dielectric constant material such as tantalum oxide is used, a heat treatment at elevated temperatures of about 700° C. or above is required for the stabilization of dielectric properties, and such a treatment promotes diffusion of cobalt atoms into silicon substrate. The similar problem occurs in the case of nickel silicide film. That is, when nickel silicide film is slimmed, nickel atoms in this nickel silicide film are diffused into silicon substrate by heat treatment and the thickness of nickel silicide film is reduced excessievely in parts to cause rise of resistance.

In quest for a solution to this and above-mentioned problems, the present inventors have pursued extensive studies for finding means for preventing diffusion of cobalt atoms to silicon substrate and consequently found that it is effective for the above purpose to use a silicon substrate of which the surface is (111) crystal face instead of a silicon substrate of which the surface is (001) crystal face, which has been used in the conventional semiconductor devices. Further, as a result of studies for obtaining means for preventing diffusion of cobalt atoms from conductive film mostly composed of nickel silicide into silicon substrate, the present inventors have found that it is also effective to use a silicon substrate of which the surface is (111) crystal face instead of using a silicon substrate of which the surface is (001) crystal face. Still further, as a result of researches for acquiring means for preventing diffusion of oxygen from insulating films mostly composed of zirconium oxide or hafnium oxide, the present inventors have found that it is effective to use a silicon substrate of which the surface is (111) crystal face instead of a silicon substrate of which the surface is (001) crystal face, which is used in the conventional semiconductor devices. They have further found that in order to prevent diffusion of oxygen, it is effective to incorporate hafnium or titanium in zirconium oxide or incorporate titanium in hafnium oxide. Moreover, they have found that the electrode materials that prevent diffusion of oxygen through the interface with insulating films mostly composed of zirconium oxide or hafnium oxide are cobalt silicide and silicon. In this connection, (100) crystal face and (010) crystal face are equivalent to (001) crystal face. Preferred use of (001) crystal face instead of (111) crystal face in the past is attributable to the difficulties involved in forming high-quality silicon oxide film on (111) crystal face. This problem, however, can be eliminated by forming an insulating film mostly composed of zirconium oxide or hafnium oxide instead of silicon oxide film, because this film can be easily formed on (111) crystal face.

The above objects of the present invention can be achieved, for example, by providing the semiconductor devices having the structures described below.

(14) A semiconductor device comprising a silicon substrate, gate dielectric films formed on a major surface of said silicon substrate, gate electrode films formed on said gate dielectric films, and wiring films mostly composed of cobalt silicide or nickel silicide, said major surface being formed so as to be (111) crystal face of the substrate.

The expression "said major surface is formed so as to be (111) crystal face of the substrate" used here includes the case where said major surface is parallel to Si (111) crystal face.

A semiconductor device described above, wherein said gate dielectric films are mostly composed of zirconium oxide.

A semiconductor device described above, wherein said gate electrode films are mostly composed of cobalt silicide or silicon.

A semiconductor device described above, wherein said gate dielectric films contain hafnium in a concentration of from 0.01 at. % inclusive to 15 at. % inclusive.

A semiconductor device described above, wherein said gate dielectric films contain titanium in a concentration of from 0.005 at. % inclusive to 15 at. % inclusive.

(15) A semiconductor device comprising a silicon substrate, gate dielectric films formed on a major surface of said silicon substrate, gate electrode films formed on said gate dielectric films, and wiring films mostly composed of cobalt silicide or nickel silicide, said gate dielectric films being mostly composed of hafnium oxide, and said major surface being formed so as to be Si (111) crystal face.

A semiconductor device described above, wherein said gate electrode films are mostly composed of cobalt silicide or silicon.

A semiconductor device described above, wherein said gate dielectric films contain titanium in a concentration of from 0.02 at. % inclusive to 8 at. % inclusive.

(16) A semiconductor device comprising a silicon substrate, gate dielectric films formed on a major surface of said silicon substrate, gate electrode films formed on said gate dielectric films, wiring films mostly composed of cobalt silicide or nickel silicide, and a memory capacitor having a high dielectric constant material as capacitor insulating film, said gate dielectric films being mostly composed of zirconium oxide, and said major surface of the substrate being parallel to Si (111) crystal face.

(17) A semiconductor device comprising a silicon substrate, gate dielectric films formed on a major surface of said silicon substrate, gate electrode films formed on said gate dielectric films, wiring films mostly composed of cobalt silicide or nickel silicide, and a memory capacitor having a high dielectric constant material as capacitor insulating film, said gate dielectric films being mostly composed of hafnium oxide, and said major surface being parallel to Si (111) crystal face.

(18) A semiconductor device comprising a silicon substrate, gate dielectric films formed on a major surface of said silicon substrate, gate electrode films formed on said gate dielectric films, wiring layers formed at a higher position than the gate electrodes, diffusion layers containing an additional element and formed on said silicon substrate in correspondence to said gate electrodes, and contact holes formed between said diffusion layers and said wiring layers, each of said contact holes having a wiring film mostly composed of cobalt silicide or nickel silicide and formed on said diffusion layer as well as a conductive film formed on said wiring film, said gate dielectric films being mostly composed of zirconium oxide or hafnium oxide, and said major surface being formed so as to be (111) crystal face of the substrate.

A semiconductor device comprising a semiconductor substrate, gate dielectric films formed on a major surface of said semiconductor substrate, gate electrode films formed on said gate dielectric films, diffusion layers containing an additional element, wiring layers formed above said gate electrode films, and contact holes formed between said diffusion layers and said wiring layers, each of said contact holes having a wiring film mostly composed of cobalt silicide or nickel silicide and formed on said diffusion layer as well as a conductive film formed on said wiring film, said major surface being formed so as to be (111) crystal face of the substrate.

A semiconductor device comprising a semiconductor substrate, gate dielectric films formed on a major surface of said semiconductor substrate, gate electrode films formed on said gate dielectric films, contact holes, and wiring layers formed above the gate electrodes and on said contact holes, each of said contact holes having a wiring film mostly composed of cobalt silicide or nickel silicide and a conductive film formed on said wiring film, and said major surface being parallel to Si (111) crystal face.

The semiconductor device according to the invention can comprise, in addition to the above-mentioned structural elements, gate dielectric films having a first layer mostly composed of silicon oxide, zirconium silicate or hafnium silicate, and a second layer mostly composed of zirconium oxide or hafnium oxide formed on said first layer.

It also can comprise, in addition to the above-mentioned structural elements, a first layer mostly composed of cobalt silicide or silicon, and a second layer mostly composed of tungsten or molybdenum formed on said first layer, said major surface being parallel to Si (111) crystal face. It also can have a third layer mostly composed of titanium nitride or tungsten nitride formed between said first and second layers.

The other objects, features and advantages of the present invention will become apparent from the following description of the embodiments of the present invention taken in conjunction with the accompanying drawings.

DETAILED DESCRIPTION OF THE INVENTION

Figure 1:
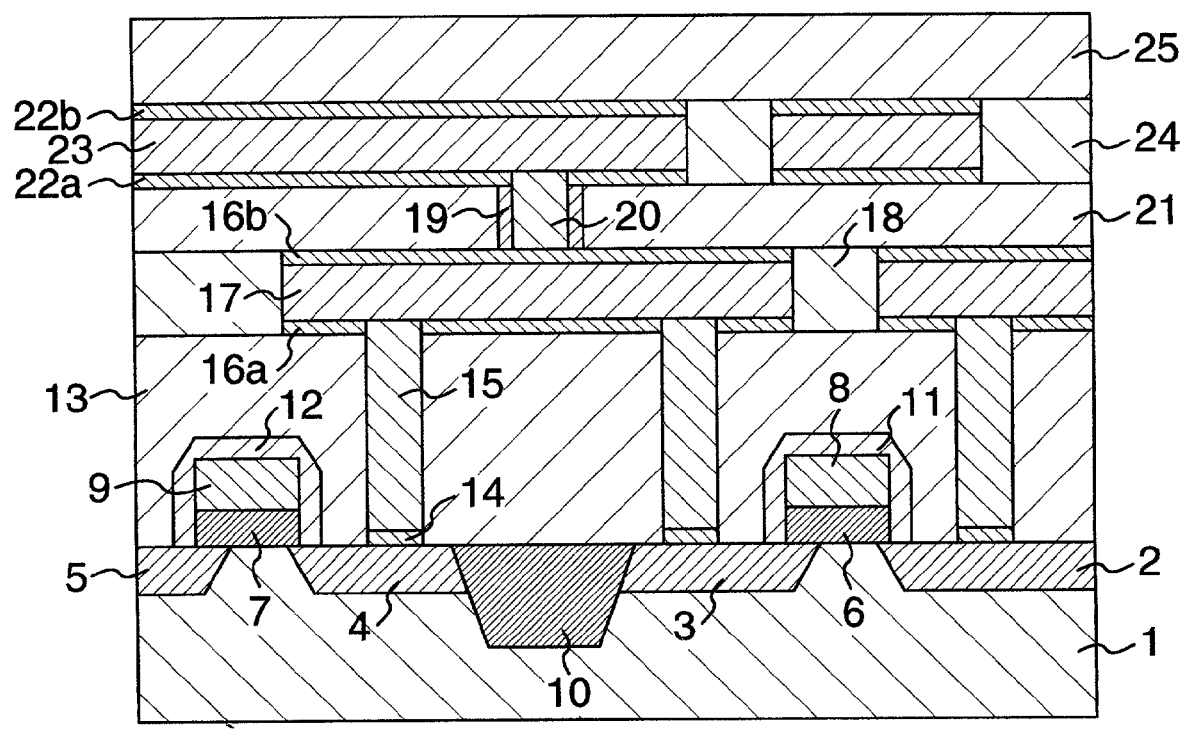
FIG. 1 is a sectional view of the principal part of the semiconductor device in the first embodiment of the present invention.

The mode of practice of the present invention is explained in more detail with reference to the embodiments thereof shown in the drawings.

A sectional structure of the principal part of the semiconductor device in the first embodiment of the present invention is shown in FIG. 1.

In the semiconductor device according to the first embodiment of the present invention, as illustrated in FIG. 1, diffusion layers 2, 3, 4, 5 are formed on a silicon substrate 1, and gate dielectric films 6, 7 and gate electrodes 8, 9 are formed on these diffusion layers 2, 3, 4, 5 to constitute MOS transistors.

Zirconium oxide or hafnium oxide is used as the main constituent of said gate dielectric films 6, 7 for meeting the requirements for miniaturization and high functionality.

These gate dielectric films 6, 7 can be formed, for example, by chemical vapor deposition (CVD) or sputtering.

A substrate of which the surface is (111) crystal face is used as silicon substrate 1 so that oxygen will not be allowed to diffuse easily into silicon substrate 1 or gate electrodes 8, 9 during heat treatment. In the semiconductor device of the instant embodiment, as shown in FIG. 1, diffusion layers 2, 3, 4, 5 having an additional element such as arsenic, phosphorus, boron or antimony diffused therein are formed on silicon substrate 1, and gate dielectric films 6, 7 and gate electrodes 8, 9 are formed thereon to constitute MOS transistors. Zirconium oxide or hafnium oxide is used as the main constituent of said gate dielectric films 6, 7 for meeting the requirements for miniaturization and high functionality of the device. For the insulating films comprising a high dielectric constant material such as mentioned above, there is used, for example, a material having a dielectric constant of 10 or greater.

These gate dielectric films 6, 7 can be formed by, for example, CVD or sputtering. A substrate of which the surface is (111) crystal face is used as silicon substrate 1 so as to prevent diffusion of oxygen into silicon substrate 1 or gate electrodes 8, 9 during heat treatment. In case of using zirconium oxide as the main constituent of gate dielectric films 6, 7, it is more preferable to contain hafnium or titanium as additional element in said dielectric films 6, 7. In case of using hafnium oxide as the main constituent of gate dielectric films 6, 7, it is more preferable to contain titanium as additional element in said gate dielectric films 6, 7. It is more preferable to use cobalt silicide or silicon as the main constituent of gate electrodes 8, 9 for preventing diffusion of oxygen from gate dielectric films 6, 7 during heat treatment. These gate electrodes 8, 9 can be formed, for example, by CVD or sputtering. MOS transistors are separated, for instance, by an element separating film 10 comprising a silicon oxide film. Insulating films 11, 12 comprising, for example, a silicon oxide film are formed over the top and side walls of said gate electrodes 8, 9.

The top of each MOS transistor is entirely covered with an insulating film 13 comprising, for example, a boron-doped phospho silicate glass (BPSG) film or spin-on-glass (SOG) film, or a silicon oxide or nitride film formed by CVD or sputtering. Contact holes are formed in said insulating film 13, and in each of said contact holes are formed a wiring film 14 for contact, mostly composed of cobalt silicide or nickel silicide, and a plug 15, which are connected to diffusion layers 2, 3, 4, 5. Since a substrate of which the surface is (111) crystal face is used as silicon substrate 1, diffusion of cobalt atoms or nickel atoms from said wiring film 14 into silicon substrate 1 is discouraged. First laminate wiring comprising main conductive film 17 covered by adjoining conductor films 16a, 16b for preventing diffusion is connected through plug 15. Plug 15 on wiring film 14 can be a deposition of conductive film, which can be a film mostly composed of tungsten. It is also possible to form a film, for example, a film of titanium nitride, on the outside of said conductive film. This laminate wiring can be obtained, for example, by forming adjacent conductor film 16a by sputtering or other means, then forming main conductor film 17 by sputtering or other means, further forming thereon another adjacent conductor film 16b by sputtering or other means, and then forming a wiring pattern by etching.

On said first laminate wiring, a plug comprising main conductor film 20 covered by adjacent conductor film 19 is formed in a contact hole formed in insulating film 21, which plug is connected to said first laminate wiring. Through this plug is connected second laminate wiring comprising main conductor film 23 covered by adjacent conductor films 22a, 22b. This second laminate wiring can be obtained, for example, by forming adjacent conductor film 22a by sputtering or other means, then forming main conductor film 23 by sputtering or other means, further forming thereon another adjacent conductor film 22b by sputtering or other means, and then forming a wiring pattern by etching.

The diffusion preventing effect in the instant embodiment of the invention is explained below. To explain the advantage of this embodiment in detail, there is shown here an analytical example using molecular dynamic simulation.

Molecular dynamic simulation is a system in which, as described for instance in Journal of Applied Physics, Vol. 54, 1983, pp. 4,864-4,878, the forces working to each atom through interatomic potential are calculated, and based on the calculated forces, Newton's equations of motion are solved to determine the position of each atom at each time point.

In the instant embodiment, the following relationships were determined by calculating the interactions between different elements by introducing charge transfer into said molecular dynamic system.

A salient advantage of the instant embodiment is that diffusion of cobalt atoms or nickel atoms from wiring film 14 into silicon substrate 1 is prevented by use of a silicon substrate of which the surface is (111) crystal face instead of a silicon substrate of which the surface is (001) crystal face employed in the conventional semiconductor devices. This controls generation of leakage current and other troubles to realize a semiconductor device with improved performance. It is also a salient advantage of the present embodiment that diffusion of oxygen from gate dielectric films 6, 7 into silicon substrate is prevented. A salient advantage of the instant embodiment is that diffusion of oxygen from gate dielectric films into silicon substrate is prevented by incorporating an additional element in gate dielectric films 6, 7. Another advantage of the instant embodiment is that diffusion of oxygen from gate dielectric films 6, 7 into gate electrodes is controlled by incorporating an additional element in said gate dielectric films. So, the effects of the instant embodiment of the present invention can be analyzed by calculating the diffusion coefficients of cobalt, nickel and oxygen. The method of calculating the diffusion coefficients by molecular dynamic simulation is described in, for instance, Physical Review B, Vol. 29 (1984), pp. 5,363-5, 371.

Figure 2:
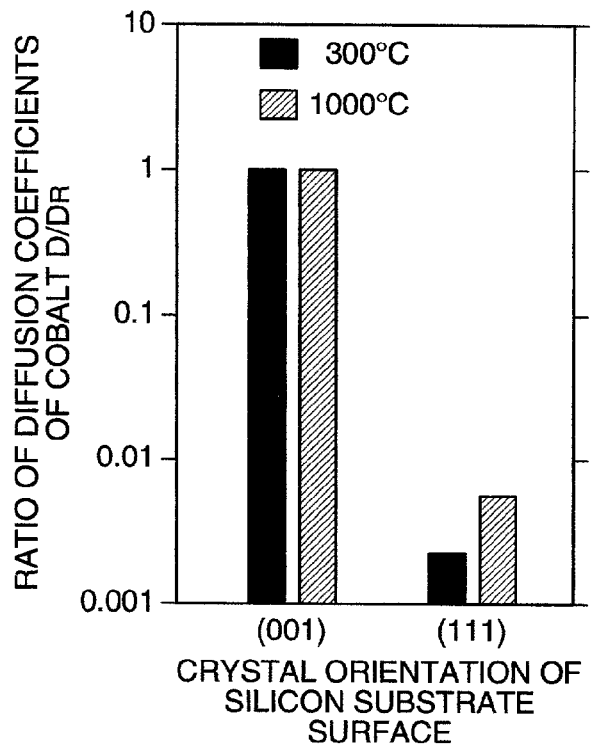
FIG. 2 is a diagram that compares the diffusion coefficient of cobalt when cobalt in a 3 nm thick cobalt silicide film was diffused into a silicon substrate of which the surface is (001) crystal face with the diffusion coefficient of cobalt when cobalt in a 3 nm thick cobalt silicide film was diffused into a silicon substrate of which the surface is (111) crystal face according to the present invention.

First, an advantage of the instant embodiment of the present invention is demonstrated by showing a calculation example using as analytical model a structure in which a 3 nm thick cobalt silicide film is formed on a 10 nm silicon substrate of which the surface is (001) crystal face and a structure in which a 3 nm thick cobalt silicide film is formed on a 10 nm thick silicon substrate of which the surface is (111) crystal face. FIG. 2 shows the result of calculation of the ratio of cobalt diffusion coefficient D in the case where cobalt in the cobalt silicide film is diffused into silicon substrate. In FIG. 2, the diffusion coefficient in the case where a silicon substrate of which the surface is (001) crystal face is used is represented by $D_R$, and the ratio of D to $D_R$ is shown. As is seen from this diagram, the diffusion coefficient in the case where a silicon substrate of which the surface is (111) crystal face is used is less than $\frac{1}{100}$ that of the case where a silicon substrate of which the surface is (001) crystal face is used, which verifies the advantage of suppressing diffusion of cobalt by use of a silicon substrate of which the surface is (111) crystal face. Thus, in this case, diffusion of cobalt from cobalt silicide film into silicon substrate is controlled, preventing rise of resistance.

Figure 3:
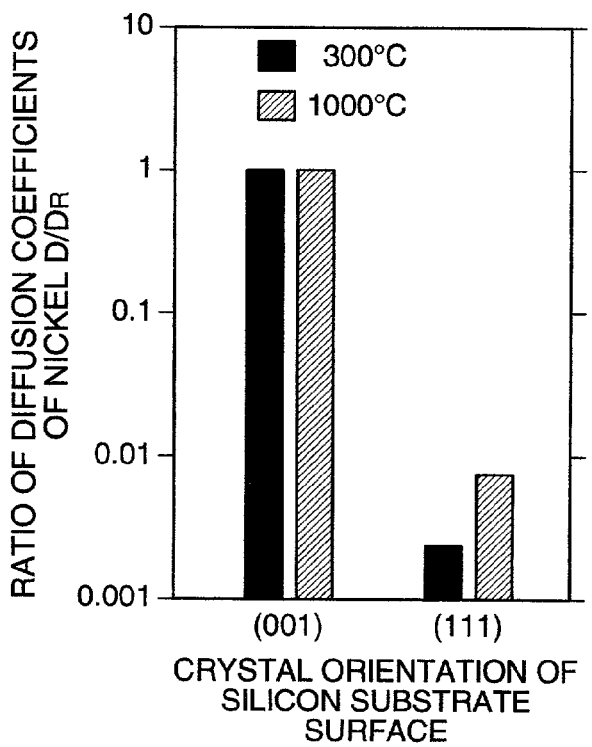
FIG. 3 is a diagram that compares the diffusion coefficient of nickel when nickel in a 3 nm thick nickel silicide film was diffused into a silicon substrate of which the surface is (001) crystal face and the diffusion coefficient of nickel when nickel in a 3 nm thick nickel silicide film was diffused into a silicon substrate of which the surface is (111) crystal face according to the the present invention.

Next, an advantage of the instant embodiment using a silicon substrate of which the surface is (111) crystal face is demonstrated by showing a calculation example using as analytical model a structure in which a 3 nm thick nickel silicide film is formed on a 10 nm thick silicon substrate of which the surface is (001) crystal face and a structure in which a 3 nm thick nickel silicide film is formed on a 10 nm silicon substrate of which the surface is (111) crystal face. FIG. 3 shows the result of calculation of the ratio of nickel diffusion coefficient D in the case where nickel in the nickel silicide film is diffused into silicon substrate. In FIG. 3, the diffusion coefficient in the case where a silicon substrate of which the surface is (001) crystal face is used is represented by $D_R$, and the ratio of D to $D_R$ is shown. As is seen from this diagram, the diffusion coefficient in the case where a silicon substrate of which the surface is (111) crystal face is used is less than $\frac{1}{100}$ that of the case where a silicon substrate of which the surface is (001) crystal face is used, which demonstrates the advantage of controlling diffusion of nickel by use of a silicon substrate of which the surface is (111) crystal face. Thus, in this case, diffusion of nickel from nickel silicide film into silicon substrate is controlled, preventing rise of resistance.

Figure 4:
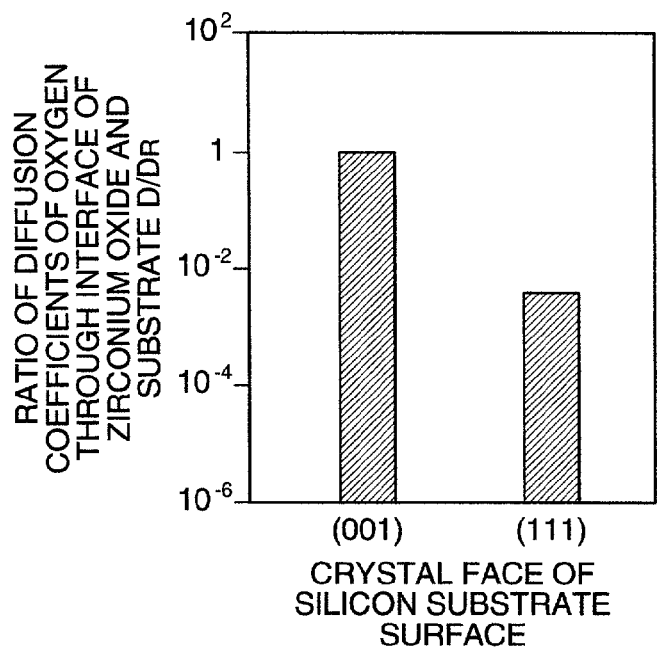
FIG. 4 is a diagram that compares the diffusion coefficient of oxygen at 300° C. when oxygen in a 3 nm thick zirconium oxide film was diffused into a silicon substrate of which the surface is (001) crystal face and the diffusion coefficient of oxygen at 300° C. when oxygen in a 3 nm thick zirconium oxide film was diffused into a silicon substrate of which the surface is (111) crystal face according to the present invention.
Figure 5:
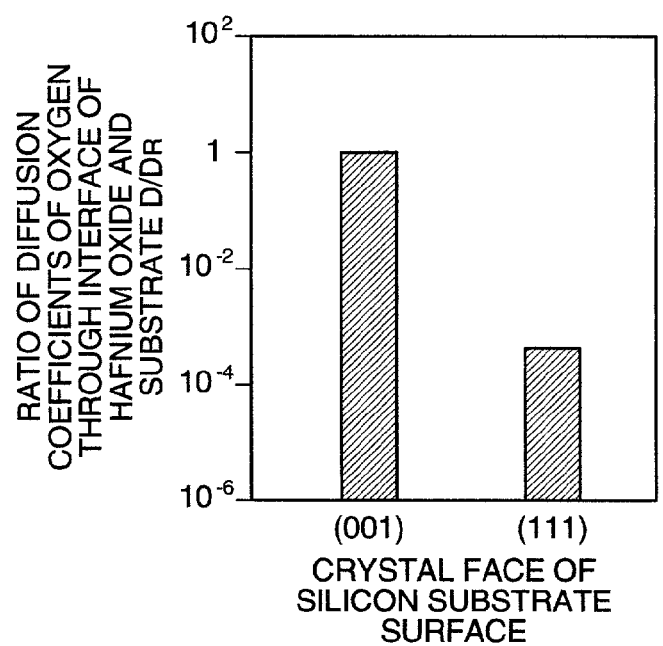
FIG. 5 is a diagram that compares the diffusion coefficient of oxygen at 300° C. when oxygen in a 3 nm thick hafnium oxide film was diffused into a silicon substrate of which the surface is (001) crystal face and the diffusion coefficient of oxygen at 300° C. when oxygen in a 3 nm thick hafnium oxide film was diffused into a silicon substrate of which the surface is (111) crystal face according to the present invention.

Next, an advantage of the instant embodiment using a silicon substrate of which the surface is (111) crystal face is demonstrated by showing a calculation example using as analytical model a structure in which a 3 nm thick gate dielectric film is formed on a 10 nm thick silicon substrate of which the surface is (001) crystal face and a structure in which a 3 nm thick gate dielectric film is formed on a 10 nm thick silicon substrate of which the surface is (111) crystal face. FIG. 4 shows the result of calculation of the ratio of diffusion coefficient D of oxygen in the case where oxygen in zirconium oxide film (gate dielectric film) is diffused into silicon substrate at 300° C. In FIG. 4, diffusion coefficient in the case where a silicon substrate of which the surface is (001) crystal face is used is represented by $D_R$, and the ratio of D to $D_R$ is shown. As is seen from the diagram, the diffusion coefficient in the case where a silicon substrate of which the surface is (111) crystal face is used is less than $\frac{1}{100}$ that of the case where a silicon substrate of which the surface is (001) crystal face is used, indicating the advantage of suppressing diffusion of oxygen in the former case. Thus, in this case, diffusion of oxygen from gate dielectric film into silicon substrate is prevented, making it less liable for zirconium oxide to suffer oxygen deficiency. The result of similar calculation in case of using hafnium oxide instead of zirconium oxide as gate dielectric film is shown in FIG. 5. In this diagram, like in the case of FIG. 4, diffusion coefficient in the case where a silicon substrate of which the surface is (001) crystal face is used is represented by $D_R$, and the ratio of D to $D_R$ is shown. As is seen from this diagram, the diffusion coefficient in the case where a silicon substrate of which the surface is (111) crystal face is used is less than $\frac{1}{100}$ that of the case where a silicon substrate of which the surface is (001) crystal face is used, demonstrating the advantage of suppressing diffusion of oxygen in the former case. Thus, in this case, diffusion of oxygen from gate dielectric film into silicon substrate is prevented, making it less liable for hafnium oxide to suffer oxygen deficiency.

Figure 6:
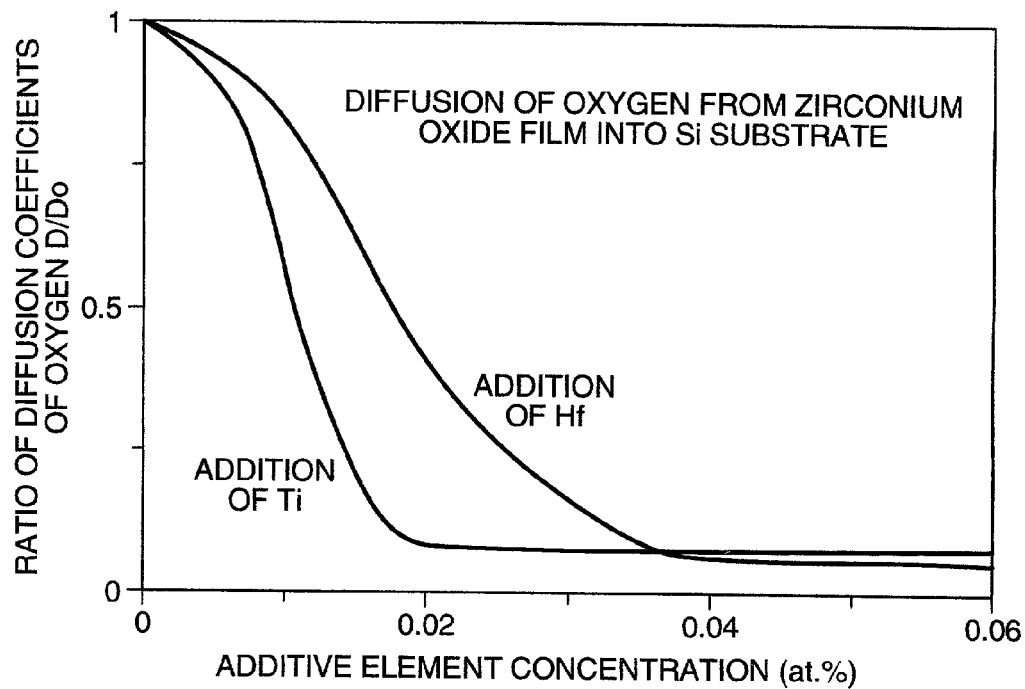
FIG. 6 is a graph showing diffusion coefficient of oxygen at 300° C. when oxygen in a 3 nm thick zirconium oxide film was diffused into a silicon substrate according to the present invention in low additional element concentration region.
Figure 7:
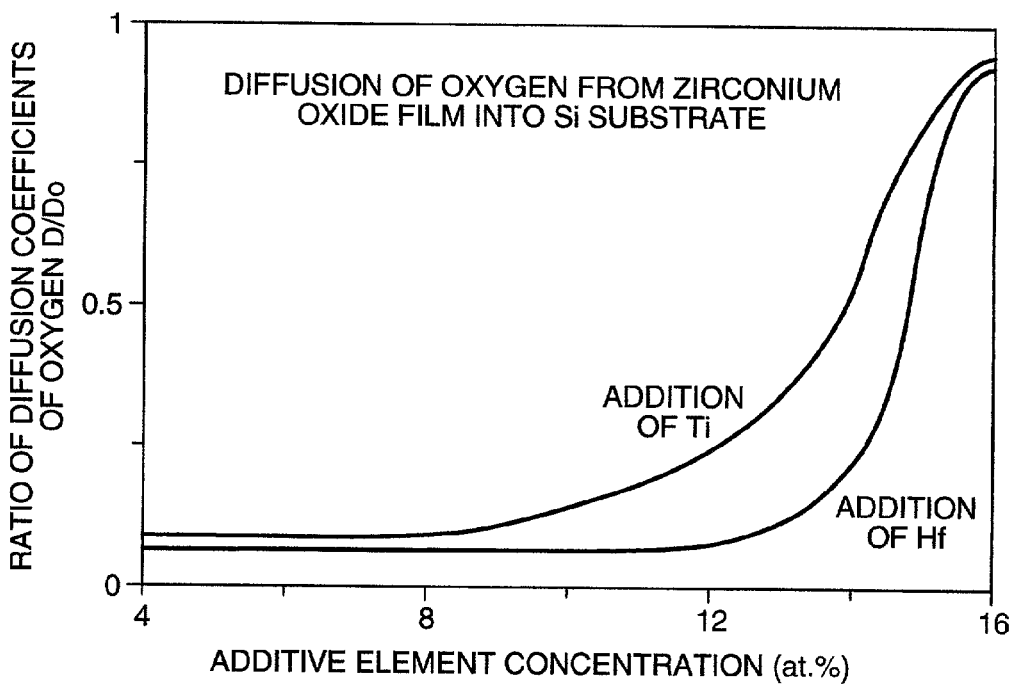
FIG. 7 is a graph showing diffusion coefficient of oxygen at 300° C. when oxygen in a 3 nm thick zirconium oxide film was diffused into a silicon substrate according to the present invention in high additional element concentration region.

Next, the effect of additional elements in the instant embodiment is demonstrated by showing a calculation example using as analytical model a structure in which a 3 nm thick gate dielectric film is formed on a 10 nm thick silicon substrate of which the surface is (111) crystal face. FIGS. 6 and 7 show the results of calculation of the ratio of diffusion coefficient D of oxygen in the case where oxygen in zirconium oxide film (gate dielectric film) was diffused into silicon substrate at 300° C. $D_0$ indicates diffusion coefficient of oxygen when no additional element is contained. FIG. 6 shows additional element concentration dependency of $D/D_0$ in the low concentration region, and FIG. 7 shows additional element concentration dependency of $D/D_0$ in the high concentration region. It can be seen from FIG. 6 that when hafnium is added in a concentration of 0.01 at. % or more in zirconium oxide film, diffusion coefficient is reduced as compared with the case of no addition of hafnium, and when hafnium is added in a concentration of 0.04 at. % or more, diffusion coefficient is unexpectedly reduced to about 1/13 that of the case of no addition.

It is also seen that when titanium is added in a concentration of 0.005 at. % or more into zirconium oxide film, diffusion coefficient is reduced as compared with the case of no addition, and when titanium is added in a concentration of 0.02 at. % or more, diffusion coefficient is unexpectedly reduced to about 1/11 that of the case of no addition.

Referring to FIG. 7, it is noted that a diffusion coefficient reducing effect can be obtained until the hafnium concentration reaches 15 at. %, but this effect is weakened when the hafnium concentration becomes 12 at. % or higher. It can be also learned that a diffusion coefficient reducing effect can be obtained until the titanium concentration reaches 15 at. %, but the effect weakened when the titanium concentration becomes 8 at. % or higher.

Thus, it is possible to reduce diffusion of oxygen by adding hafnium in a concentration of from 0.01 at. % inclusive to 15 at. % inclusive or titanium in a concentration of from 0.005 at. % inclusive to 15 at. % inclusive into a film mostly composed of zirconium oxide.

Further, diffusion of oxygen can be reduced steadily and more intensely by adding hafnium in a concentration of from 0.04 at. % inclusive to 12 at. % inclusive or titanium in a concentration of from 0.02 at. % inclusive to 8 at. % inclusive into a film mostly composed of zirconium oxide.

The above-described advantages of the first embodiment of the present invention can be obtained with little variation even if the calculation conditions such as film thickness and temperature are changed.

Figure 8:
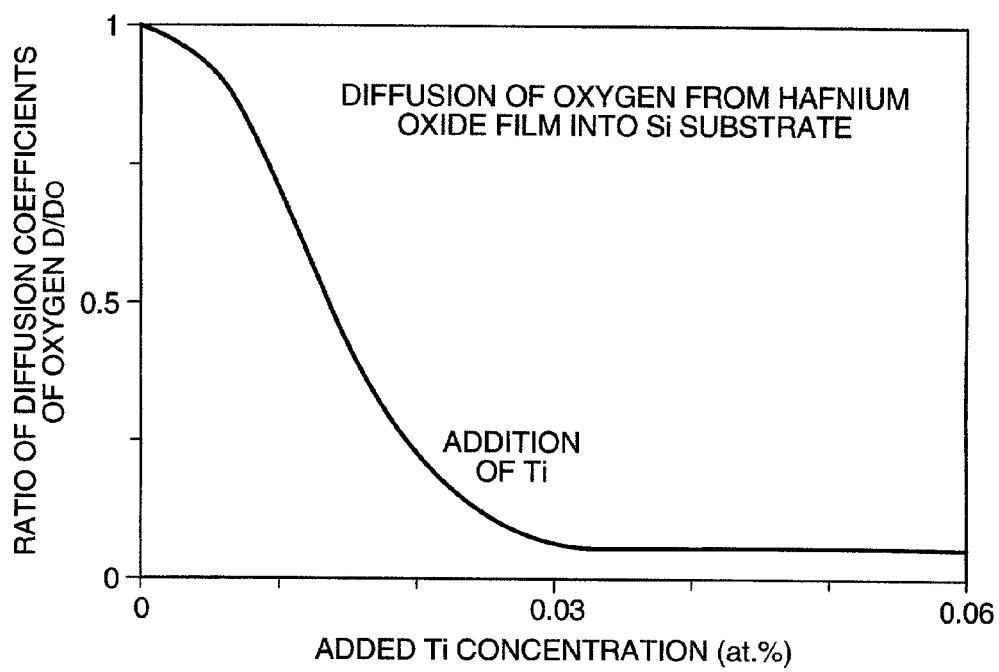
FIG. 8 is a graph showing diffusion coefficient of oxygen at 300° C. when oxygen in a 3 nm thick hafnium oxide film was diffused into a silicon substrate according to the present invention in low additional element concentration region.
Figure 9:
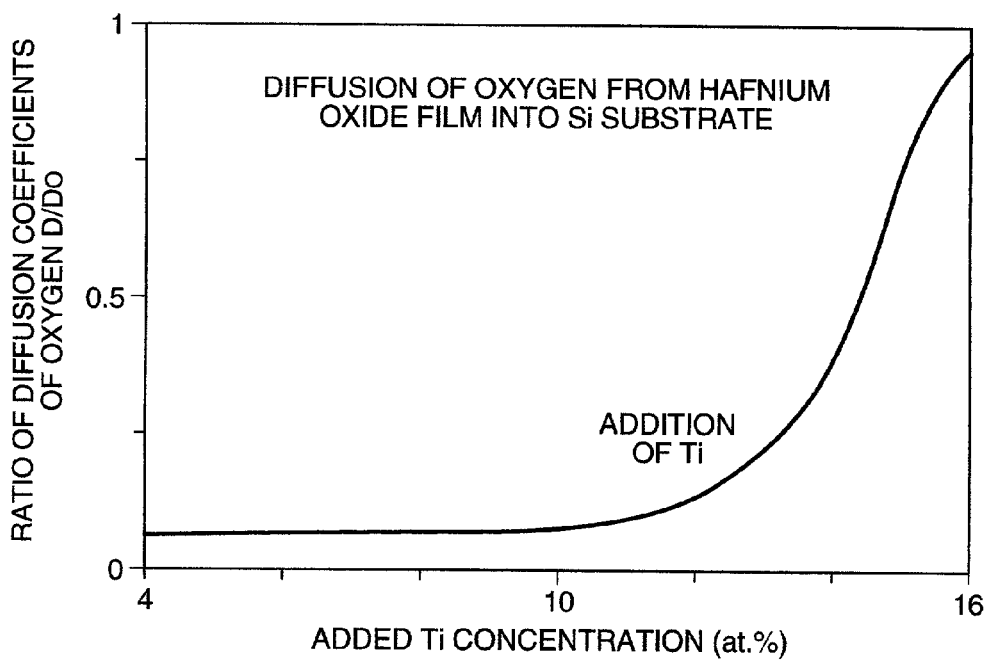
FIG. 9 is a graph showing diffusion coefficient of oxygen at 300° C. when oxygen in a 3 nm thick hafnium oxide film was diffused into a silicon substrate according to the present invention in high additional element concentration region.

FIGS. 8 and 9 show the results of calculation of the ratio of diffusion coefficient D of oxygen in the case where oxygen in hafnium oxide film (gate dielectric film) is diffused into silicon substrate in an analytical model similar to those of FIGS. 6 and 7. $D_0$ indicates diffusion coefficient of oxygen when no additional element is contained. FIG. 8 shows additional element concentration dependency of $D/D_0$ in the low concentration region.

It is seen from FIG. 8 that when titanium is added in a concentration of 0.01 at. % or more in hafnium oxide film, diffusion coefficient is reduced as compared with the case of no addition of titanium, and when titanium is added in a concentration of 0.03 at. % or more, diffusion coefficient is unexpectedly reduced to about 1/13 that of the case of no addition.

It can be also learned from FIG. 9 that there can be obtained a significant diffusion coefficient reducing effect until titanium concentration goes up to 15 at. %, but the effect is weakened when titanium concentration becomes 10 at. % or higher.

It is thus possible to reduce diffusion of oxygen by adding titanium in a concentration of from 0.01 at. % inclusive to 15 at. % inclusive in a film mostly composed of hafnium oxide.

Oxygen diffusion can be further prevented more intensely and steadily by adding titanium in a concentration of from 0.03 at. % inclusive to 10 at. % inclusive into a film mostly composed of hafnium oxide.

The advantages of the present invention described above can be obtained with little variation even if the calculation conditions such as film thickness and temperature are changed.

Figure 10:
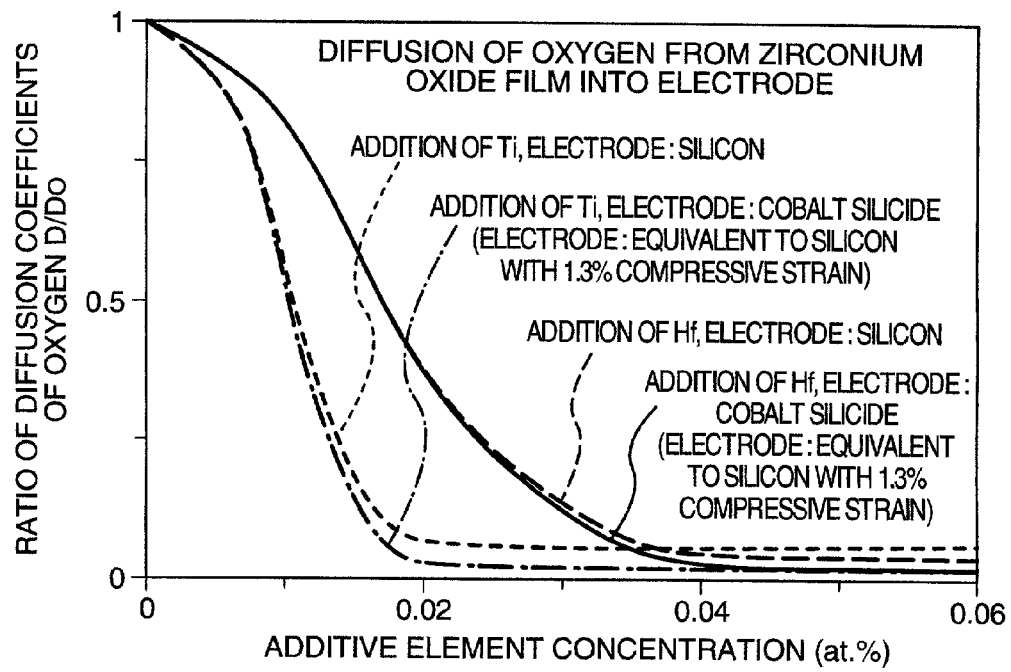
FIG. 10 is a graph showing diffusion coefficient of oxygen at 300° C. when using an analytical model of a structure having a 3 nm thick electrode film formed on a 3 nm thick zirconium oxide film according to the present invention in low additional element concentration region.
Figure 11:
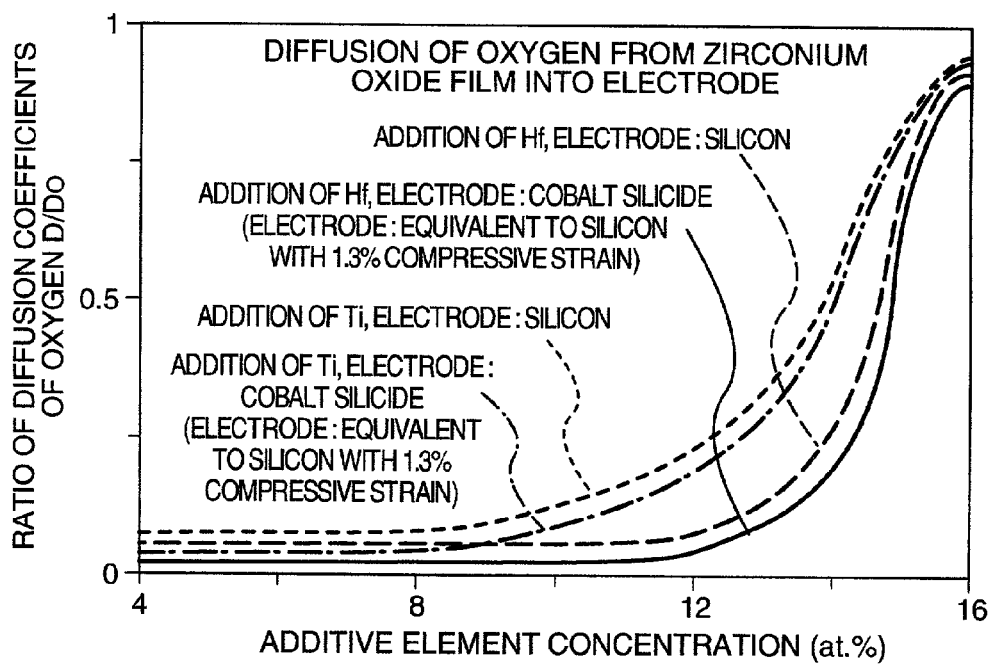
FIG. 11 is a graph showing diffusion coefficient of oxygen at 300° C. when using an analytical model of a structure having a 3 nm thick electrode film formed on a 3 nm thick zirconium oxide according to the present invention in high additional element concentration region.

Next, as another advantage of the instant embodiment, it is demonstrated by molecular dynamic analytical examples that diffusion of oxygen from gate dielectric film into gate electrodes can be controlled by incorporating an additional element into the film. Here, there is shown a case where diffusion coefficient of oxygen at 300° C. is calculated by using as analytical model a structure in which a 3 nm thick electrode film is formed on a 3 nm thick gate dielectric film. FIGS. 10 and 11 show the results obtained from the case where zirconium oxide is used as gate dielectric film and cobalt silicide film and silicon film are used as electrodes. $D_0$ indicates diffusion coefficient of oxygen when no additional element is incorporated. FIG. 10 shows additional element concentration dependency of $D/D_0$ in the low concentration region, and FIG. 11 shows additional element concentration dependency of $D/D_0$ in the high concentration region.

From FIG. 10, it is noted that, as in the case of FIG. 6, when hafnium is added in a concentration of 0.01 at. % or more into zirconium oxide film, diffusion coefficient is reduced as compared with the case of no addition of hafnium, and when it is added in a concentration of 0.04 at. % or more, diffusion coefficient is unexpectedly reduced to about 1/13 or less that of the case of no addition.

It is also seen that when titanium is added in a concentration of 0.005 at. % or more into zirconium oxide film, diffusion coefficient is reduced as compared with the case of no addition of titanium, and when it is added in a concentration of 0.02 at. % or more, diffusion coefficient is unexpectedly reduced to about 1/12 or less that of the case of no addition.

It is noted from FIG. 11 that, as in the case of FIG. 7, a significant diffusion coefficient reducing effect is obtainable until hafnium concentration reaches 15 at. %, but the effect is weakened when hafnium concentration becomes 12 at. % or higher.

It is also noted that a diffusion coefficient reducing effect can be obtained until titanium concentration goes up to 15 at. %, but the effect is weakened when titanium concentration becomes 8 at. % or higher.

It is thus possible to suppress diffusion of oxygen by adding hafnium in a concentration of from 0.01 at. % inclusive to 15 at. % inclusive or titanium in a concentration of from 0.005 at. % inclusive to 15 at. % inclusive into a film mostly composed of zirconium oxide.

Diffusion of oxygen can also be reduced by adding hafnium in a concentration of from 0.04 at. % inclusive to 12 at. % inclusive or titanium in a concentration of 0.02 at. % inclusive to 8 at. % inclusive into a film mostly composed of zirconium oxide.

The above advantages can be obtained with little variation even if the calculation conditions such as film thickness and temperature are changed.

Figure 12:
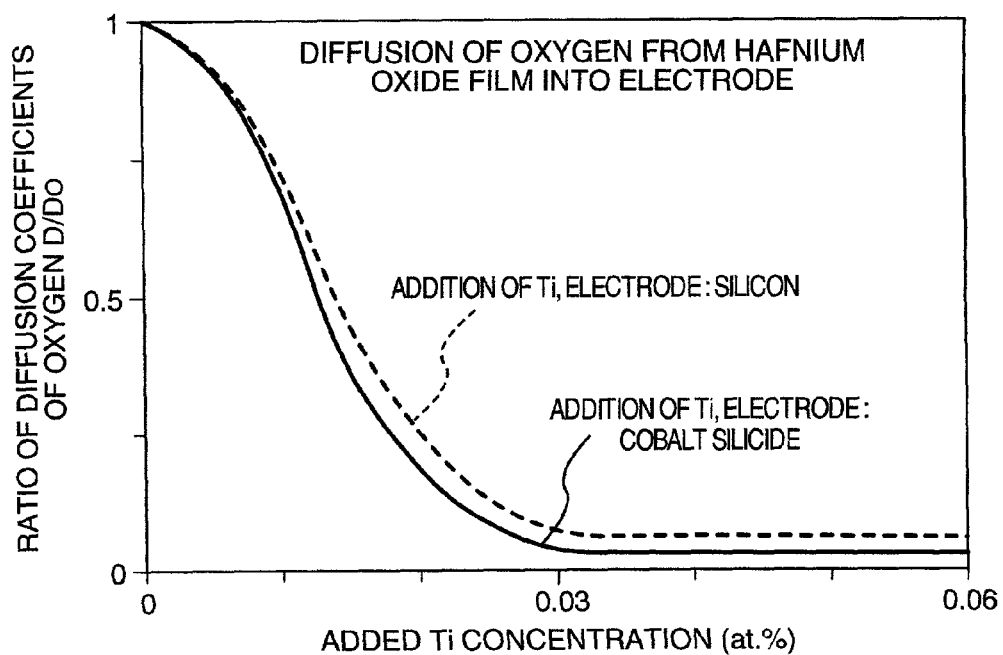
FIG. 12 is a graph showing diffusion coefficient of oxygen at 300° C. when using an analytical model of a structure having a 3 nm thick electrode film formed on a 3 nm thick hafnium oxide film according to the present invention in low additional element concentration region.
Figure 13:
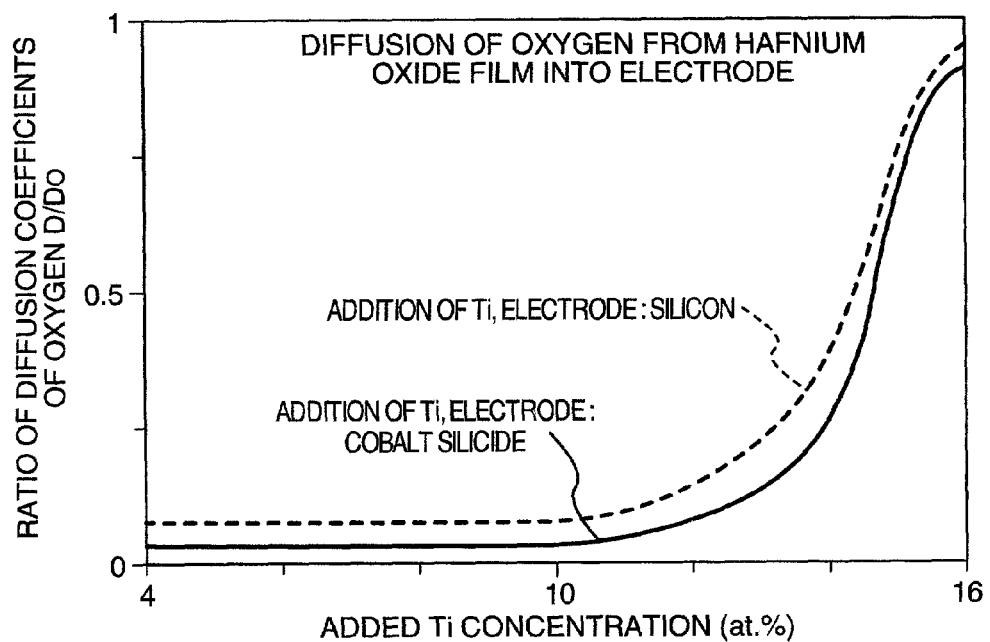
FIG. 13 is a graph showing diffusion coefficient of oxygen at 300° C. when using an analytical model of a structure having a 3 nm thick electrode film formed on a 3 nm thick hafnium oxide film according to the present invention in high additional element concentration region.

FIGS. 12 and 13 show an example of the results for a similar analytical model using hafnium oxide as gate dielectric film and cobalt silicide film and silicon film as electrodes. $D_0$ indicates diffusion coefficient of oxygen in case no additional element is contained. FIG. 12 shows additional element concentration dependency of $D/D_0$ in the low concentration region, and FIG. 13 shows such dependency in the high concentration region.

It can be seen from FIG. 12 that, as in the case of FIG. 8, when titanium is added in a concentration of 0.01 at. % or more in hafnium oxide film, diffusion coefficient is reduced as compared with the case where no titanium is added, and when it is added in a concentration of 0.03 at. % or more, diffusion coefficient is unexpectedly reduced to 1/13 or less that of the case of no addition.

It can be also known from FIG. 13 that, as in the case of FIG. 9, the diffusion coefficient reducing effect is observed until titanium concentration reaches 15 at. %, but the effect is weakened when titanium concentration is 10 at. % or more.

It is thus possible to reduce diffusion of oxygen by adding titanium in a concentration of from 0.03 at. % inclusive to 10 at. % inclusive into a film mostly composed of hafnium oxide.

Oxygen diffusion can be reduced more intensely and steadily by adding titanium in a concentration of from 0.03 at. % inclusive to 10 at. % inclusive into a film mostly composed of hafnium oxide.

These advantages are provided with little variation even when the calculation conditions such as film thickness and temperature are changed.

Figure 14:
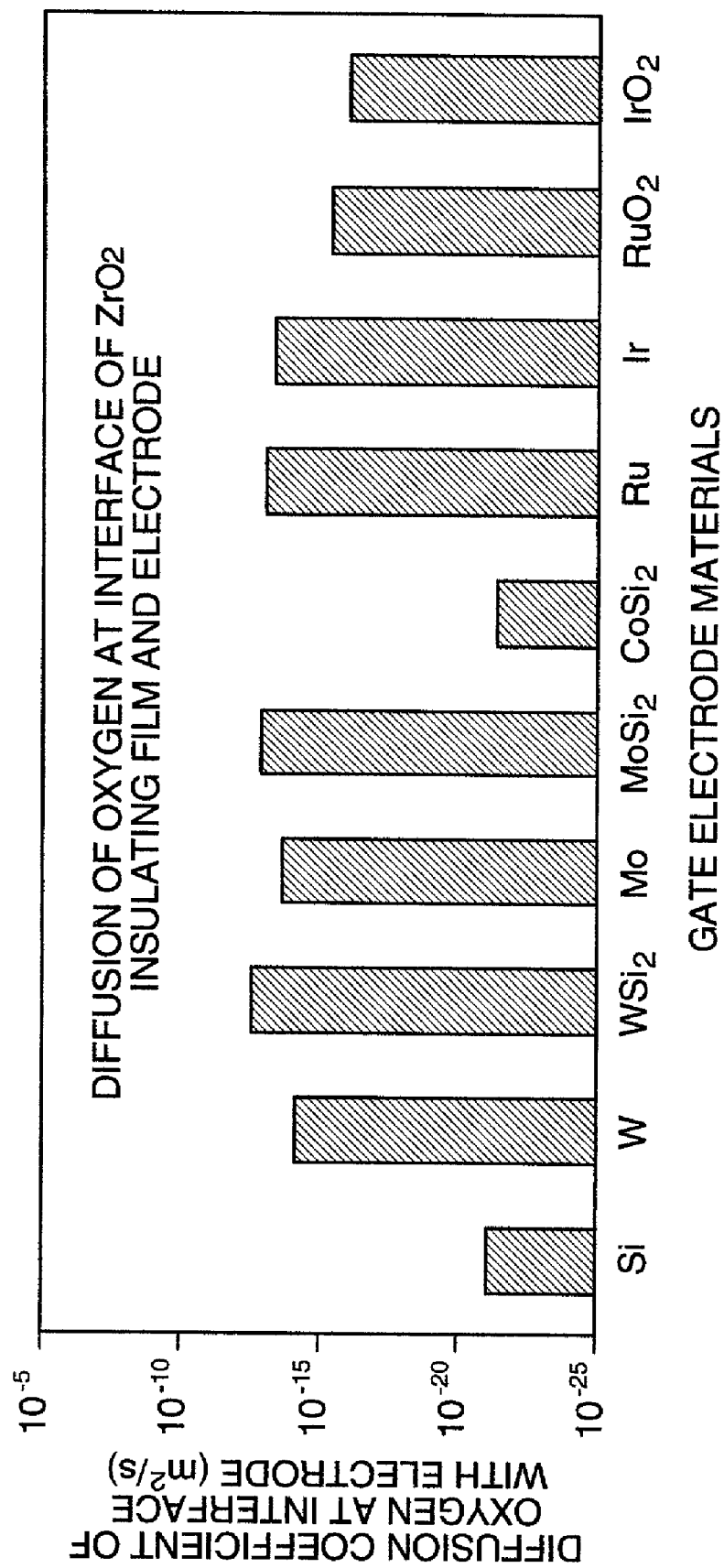
FIG. 14 is a diagram showing diffusion coefficients of oxygen for various types of electrode material by using an analytical model of a structure having a 3 nm thick electrode film formed on a 3 nm thick zirconium oxide.
Figure 15:
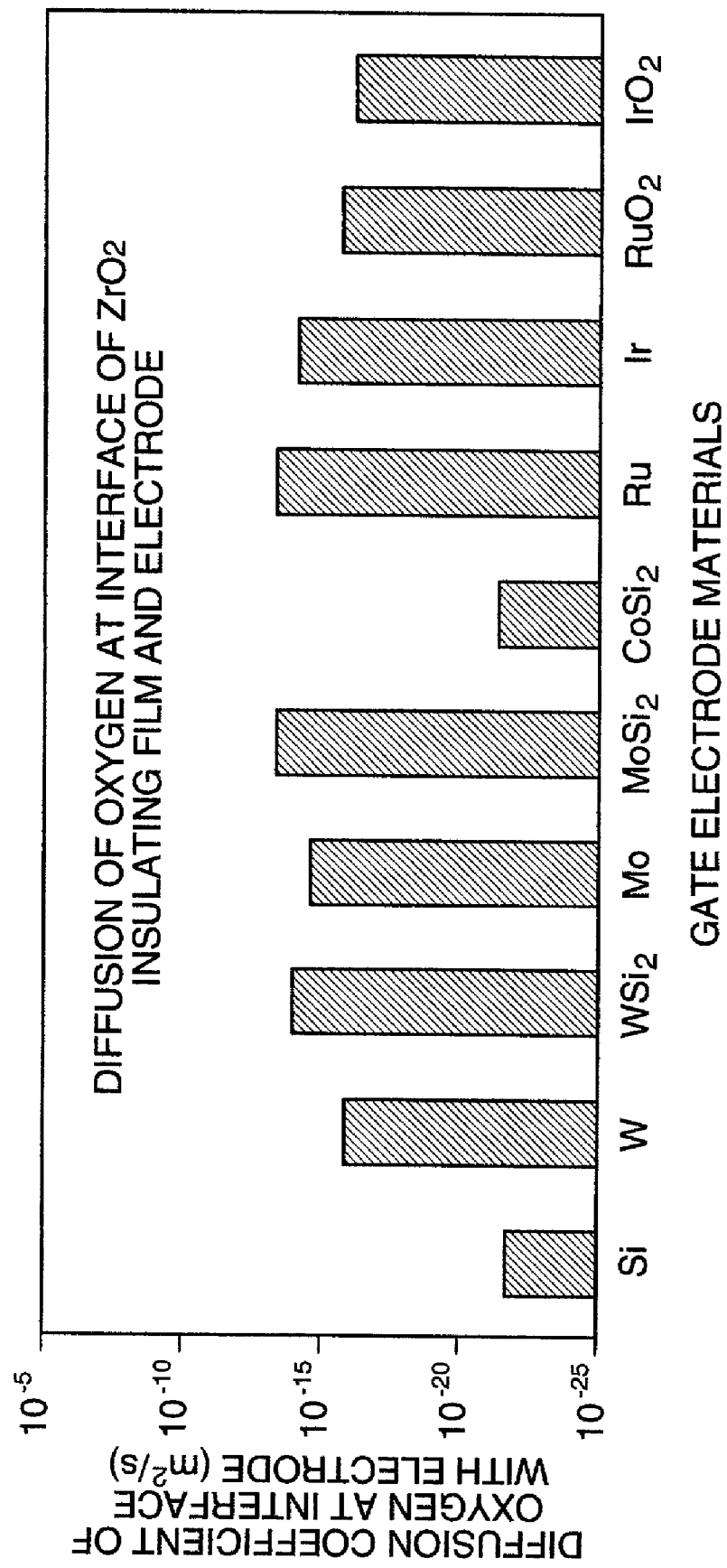
FIG. 15 is a diagram showing diffusion coefficients of oxygen for various types of electrode material by using an analytical model of a structure having a 3 nm thick electrode film formed on a 3 nm thick hafnium oxide.

In the foregoing calculation examples, cobalt silicide film and silicon film are used as electrodes, but similar effect can be obtained by using other materials. Preference of use of cobalt silicide and silicon, however, is demonstrated by the following calculation example. FIGS. 14 and 15 show the results of calculation of diffusion coefficient of oxygen for various electrode materials when using as analytical model a structure in which a 3 nm thick electrode film is formed on a 3 nm thick gate dielectric film. Shown here is diffusion coefficient of oxygen at 300° C. in case no additional element is contained, with FIG. 14 showing the results when gate dielectric film is composed of zirconium oxide, and FIG. 15 showing the results when gate dielectric film is composed of hafnium oxide. It can be learned from FIGS. 14 and 15 that when cobalt silicide and silicon are used as electrode materials, diffusion coefficient is unexpectedly smaller than the case where other electrode materials are used. It is therefore more preferable to use cobalt silicide and silicon as electrode materials for reducing diffusion of oxygen.

Figure 16:
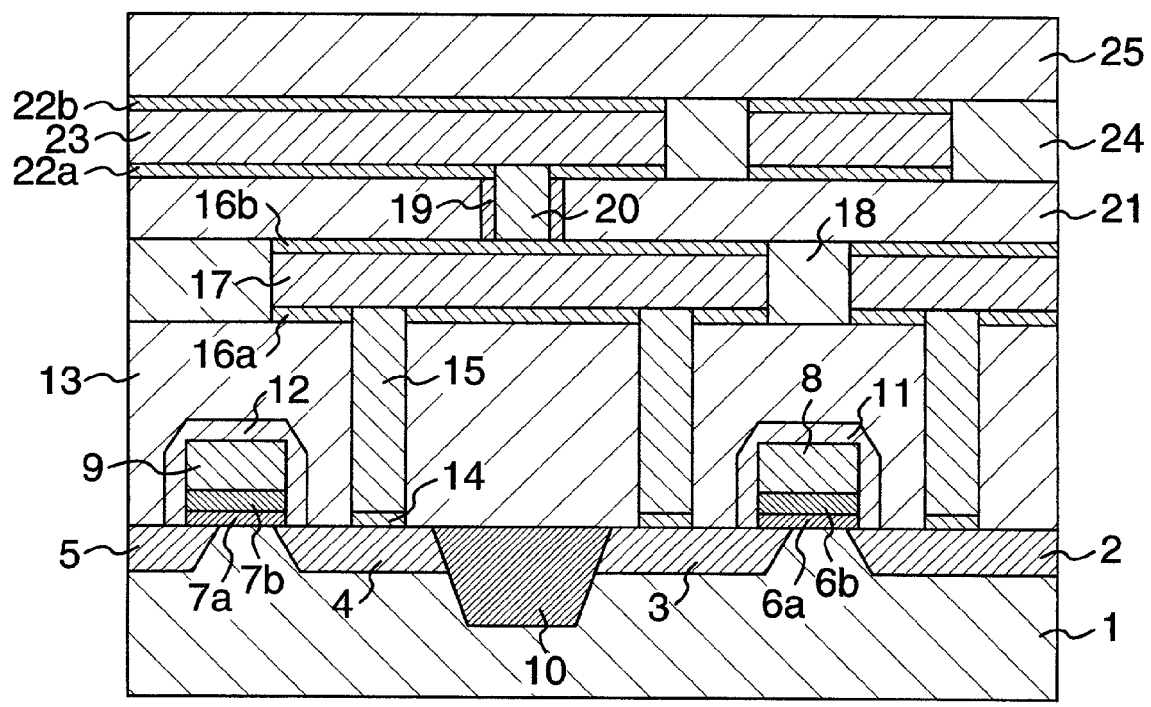
FIG. 16 is a sectional view of the principal part of the semiconductor device in the second embodiment of the present invention.

FIG. 16 shows a sectional structure of the principal part of the semiconductor device according to the second embodiment of the present invention. A major difference of this second embodiment from the first embodiment is that the gate dielectric film is of a two-layer structure comprising first gate dielectric films 6a, 7a and second gate dielectric films 6b, 7b. Second gate dielectric films 6b, 7b are mostly composed of zirconium oxide or hafnium oxide for meeting the requirements for miniaturization and high functionality. For first gate dielectric films 6a, 7a, there is used, for instance, silicon oxide, zirconium silicate or hafnium silicate as main constituent. It is thereby possible to produce the same advantage as in the first embodiment and to improve thermal stability of second gate dielectric films 6b, 7b. In the above example, gate dielectric film is of a double-layer structure, but it is also possible to provide a structure of three or more layers for gate dielectric film although not shown in the drawings.

Figure 17:
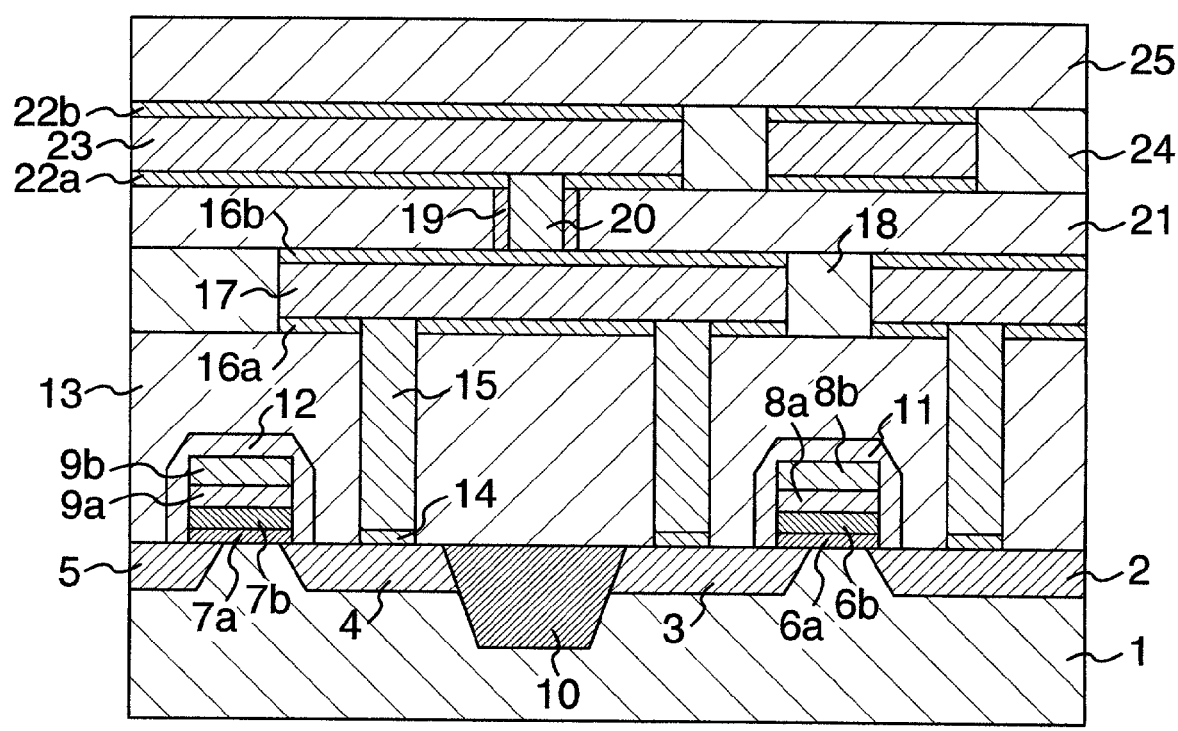
FIG. 17 is a sectional view of the principal part of the semiconductor device in the third embodiment of the present invention.

FIG. 17 shows a sectional structure of the principal part of the semiconductor device according to the third embodiment of the present invention. A major difference of this third embodiment from the second embodiment is that gate electrode film is of a two-layer structure comprising first gate electrode films 8a, 9a and second gate electrodes films 8b, 9b. Other mechanisms can be the same as those in the second embodiment. It is more preferable to use cobalt silicide or silicon as main constituent of first gate electrode films 8a, 9a as these materials are more repressive against diffusion of oxygen. For second gate electrode films 8b, 9b, it is more preferable to use a film mostly composed of a metal such as tungsten or molybdenum so as to reduce electric resistance of the whole gate electrodes. In this case, although not shown in the drawings, another conductive film may be disposed between first gate electrodes films 8a, 9b and second gate electrode films 8b, 9b. As such another conductive film, it is more preferable to use a film, such as TiN film or WN film, having the effect of preventing mutual diffusion of first gate electrode films 8a, 9a and second gate electrode films 8b, 9b.

As described above, according to the third embodiment of the present invention, it is possible to obtain the same advantages as in the second embodiment and an additional advantage of reducing electric resistance of gate electrodes.

Figure 18:
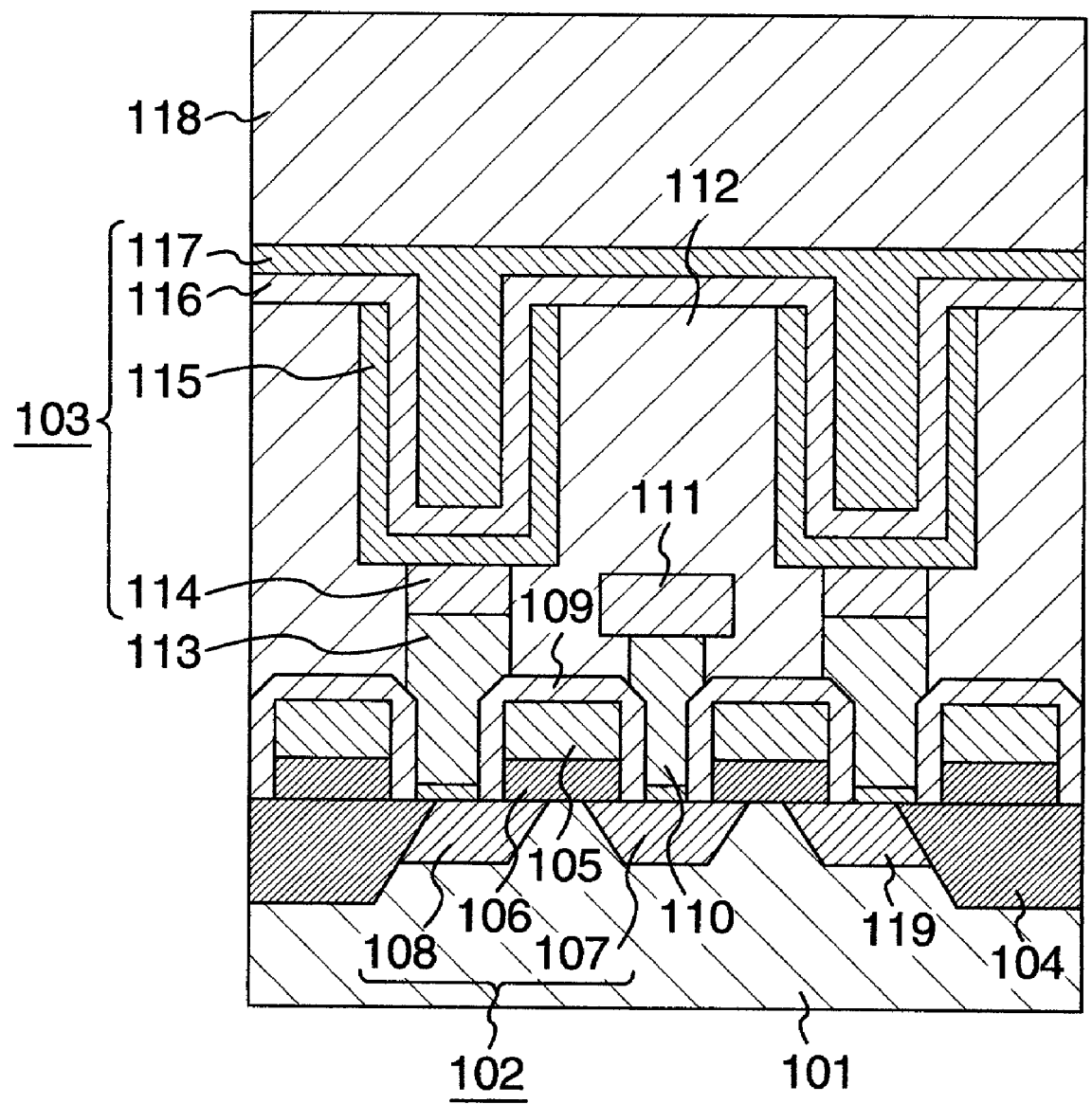
FIG. 18 is a sectional view of the principal part of the semiconductor device in the fourth embodiment of the present invention.

FIG. 18 shows a sectional structure of the semiconductor device according to the fourth embodiment of the present invention. A major difference of this fourth embodiment from the first, second and third embodiments is that this embodiment has a capacitor element 103 for storing information having a structure comprising a laminate of conductive barrier film 114, capacitor lower electrode 115, highly dielectric or ferroelectric oxide film 116 and capacitor upper electrode 117. It is known that highly dielectric or ferroelectric oxide film 116 does not exhibit its advantageous properties unless it is subjected to heat treatment. So, it is necessary to carry out heat treatment of about 600° C. or higher, more preferably about 700° C. or higher in the production process. During this heat treatment, cobalt or nickel is liable to diffuse from contact wiring film 119 into silicon substrate 101, and oxygen is liable to diffuse from gate dielectric film 106 into silicon substrate 101, so that in the case of a semiconductor memory having highly dielectric or ferroelectric oxide film, there is a greater necessity of controlling diffusion of said elements.

The principal structure of the semiconductor device according to the fourth embodiment is explained below. The semiconductor device of the instant embodiment comprises metal oxide semiconductor (MOS) transistors 102 formed in the active region on the major surface of silicon substrate 101, and capacitor elements 103 for storing information disposed on said transistors. 104 indicates element separation, and 109 shows insulating film. Insulating film 112 is a film for inter-elemental separation. MOS transistor 102 of memory cell is composed of gate electrode film 105, gate dielectric film 106 and diffusion layer 107. For gate dielectric film 106, zirconium oxide or hafnium oxide is used as main constituent for meeting the requirements for miniaturization and high functionality. This gate dielectric film 106 can be formed, for example, by CVD or sputtering. In case of using zirconium oxide as main constituent of gate dielectric film so as to suppress diffusion of oxygen into silicon substrate or gate electrodes, it is more preferable to incorporate hafnium or titanium as additional element into gate dielectric film. In case of using hafnium oxide as main constituent of gate dielectric film, it is preferable to incorporate titanium as additional element into gate dielectric film. Gate dielectric film may have a structure of two or more layers as in the second and third embodiments. It is more preferable to use cobalt silicide or silicon as main constituent of gate electrode film 105 as these materials are suppressive of diffusion of oxygen. Gate electrodes may have a structure of two or more layers as in the third embodiment. This electrode film 105 can be formed, for example, by CVD or sputtering. Also, insulating film 9 composed of, for instance, silicon oxide is formed on the top and around the side wall of said gate electrode film 105.

Bit line 111 is connected via plug 110 to diffusion layer 107 at a side of MOS transistor for memory cell selection. The top of MOS transistor is entirely covered with insulating film 112, which is composed of boron-doped phospho silicate glass (BPSG) film, spin on glass (SOG) film or silicon oxide or nitride film formed by CVD or sputtering. Capacitor element 103 for storing information is formed on insulating film 112 covering MOS transistor. This capacitor element 103 for storing information is connected to diffusion layer 108 at the other side of said MOS transistor for memory cell selection via plug 113 composed of, for example, polycrystalline silicon and wiring film 119 for contact mostly composed of cobalt silicide or nickel silicide. Said capacitor element 103 for storing information has a structure comprising, laminated from bottom upwards, conductive barrier film 114, capacitor lower electrode 115, high dielectric constant oxide film 116, and capacitor upper electrode 117. This capacitor upper electrode 117 is covered with insulating film 118. Tantalum oxide, for instance, is used as main constituent of oxide film 116. Zirconium oxide or hafnium oxide is also usable. Capacitor element 103 for storing information is covered with insulating film 115.

It is preferable to use silicon film having (111) orientation for capacitor upper electrode or capacitor lower electrode so as to prevent diffusion of oxygen into these electrodes during heat treatment.

In case of using zirconium oxide as main constituent of oxide film 116, it is more preferable to incorporate hafnium or titanium as additional element into said film 116.

When using hafnium oxide as main constituent of oxide film 116, it is more preferable to incorporate titanium as additional element into oxide film 116. Capacitor element 103 is covered with insulating film 118.

In the fourth embodiment of the present invention, as described above, there can be obtained the similar advantage as in the first embodiment.

As another embodiment of the present invention, it can be a system LSI comprising memory LSI such as used in the fourth embodiment and logic LSI such as used in the first, second and third embodiments, both being provided on the same one substrate.

It is also possible to obtain information-storing capacitor element 103 with high performance by first forming vertical grooves, then forming capacitor lower electrode 115, further forming high dielectric constant film (oxide film 116 having high dielectric constant), then forming capacitor upper electrode 117, and after forming said high dielectric constant film or capacitor upper electrode 117, conducting a high-temperature (850-950° C.) heat treatment.

Figure 19:
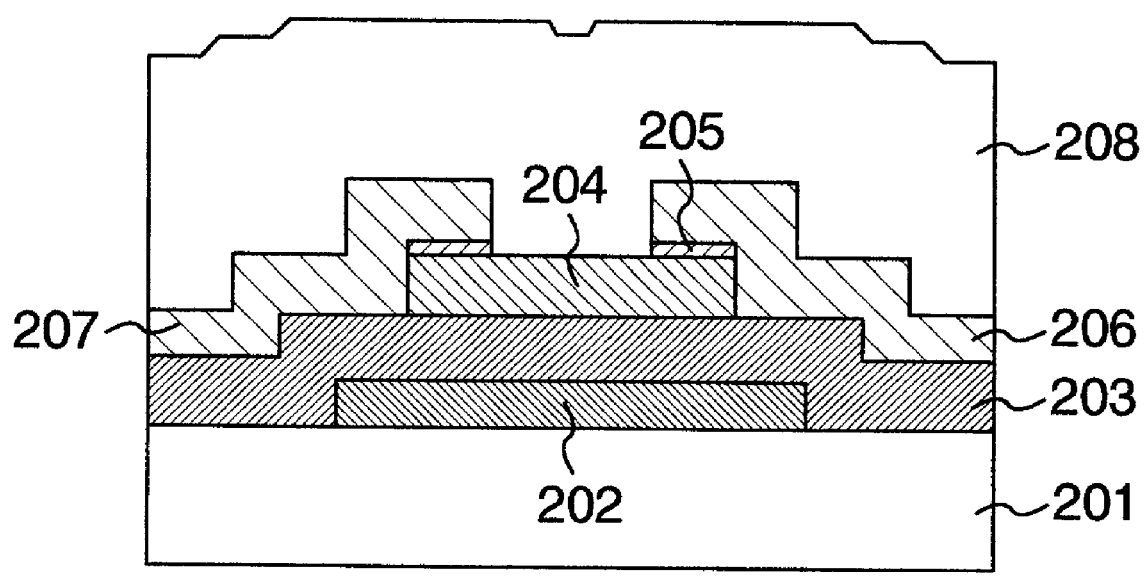
FIG. 19 is a sectional view of the TFT structure of the semiconductor device in the fifth embodiment of the present invention.

FIG. 19 shows a thin film transistor (TFT) structure in the semiconductor device according to the fifth embodiment of the present invention. This semiconductor device of the fifth embodiment of the present invention has a TFT structure in which, as shown in FIG. 19, there are formed on, for instance, a glass substrate 201, a conductive film (silicon film) 202 composed of polycrystalline silicon, an insulating film (gate dielectric film) 203 mostly composed of zirconium oxide or hafnium oxide, a conductive film (gate electrode film) 204 composed of polycrystalline silicon, for instance, an n-type silicon film 205, a drain electrode film 206, a source electrode film 207, and an insulating film 208.

In order to prevent oxygen from diffusing out from insulating film 203 mostly composed of zirconium oxide or hafnium oxide, a silicon film having (111) orientation is used as conductive film 202 or 204.

By these means, it is possible in the fifth embodiment of the present invention, too, to prevent diffusion of oxygen from insulating film 203 and to realize a semiconductor device having a TFT structure with improved characteristics.

The following advantages are derived from the embodiments of the present invention.

A silicon substrate of which the surface is (111) crystal face is used.

Hafnium or titanium is added to zirconium oxide, or titanium is added to hafnium oxide in the insulating films.

Cobalt silicide or silicon is used as electrode material which is deterrent against diffusion of oxygen through the interface with insulating film mostly composed of zirconium oxide or hafnium oxide.

Further, a polycrystalline silicon film having (111) orientation is used for the semiconductor devices having a TFT structure.

By these means, it is possible to prevent deterioration of characteristics concomitant to miniaturization and to realize a semiconductor device with high reliability.

It is further possible to realize a miniaturized and high-yield semiconductor device.

It is also made possible to realize a semiconductor device having a gate structure which controls diffusion of oxygen at the interface between silicon substrate and gate dielectric film.

There is further realized a semiconductor device having a TFT structure, which suppresses diffusion of oxygen at the interface between silicon film and gate dielectric film.

It should be further understood by those skilled in the art that the foregoing description has been made on embodiments of the invention and that various changes and modifications may be made in the invention without departing from the spirit of the invention and the scope of the appended claims.

What is claimed is:

1. A semiconductor device comprising a silicon substrate, gate dielectric films mostly composed of zirconium oxide and formed on a major surface of said silicon substrate, and gate electrode films formed in contact with said gate dielectric films, said major surface of said silicon substrate being parallel to Si (111) crystal face, wherein said gate electrode films are mostly composed of cobalt silicide or silicon, and wherein said gate dielectric films contain hafnium in a concentration of from 0.01 at. % inclusive to 15 at. % inclusive.

2. A semiconductor device according to claim 1, wherein said gate dielectric films contain titanium in a concentration of from 0.005 at. % inclusive to 15 at. % inclusive.

3. A semiconductor device according to claim 2, wherein said gate dielectric films contain hafnium in a concentration of from 0.04 at. % inclusive to 12 at. % inclusive.

4. A semiconductor device according to claim 2, wherein said gate dielectric films contain titanium in a concentration of from 0.02 at. % inclusive to 8 at. % inclusive.

5. A semiconductor device comprising a silicon substrate, gate dielectric films formed on a major surface of said silicon substrate, gate electrode films formed on said gate dielectric films, and wiring films for contact formed on said major surface of said silicon substrate, said wiring firms being mostly composed of cobalt silicide or nickel silicide, said gate dielectric films being mostly composed of hafnium oxide, and said major surface being formed so as to be Si (111) crystal face, wherein said gate dielectric films contain titanium in a concentration of from 0.02 at. % inclusive to 8 at. % inclusive.

6. A semiconductor device according to claim 5, wherein said gate electrode films are mostly composed of cobalt silicide or silicon.

7. A semiconductor device comprising a silicon substrate, gate dielectric films formed on a major surface of said silicon substrate, gate electrode films formed on said gate dielectric films, and wiring films for contact formed on said major surface of said silicon substrate, said wiring firms being mostly composed of cobalt silicide or nickel silicide, said major surface being formed so as to be (111) crystal face of the substrate, wherein the substrate having (111) orientation is used to prevent diffusion of cobalt from the wiring films into the substrate, wherein said gate dielectric films contain hafnium in a concentration of from 0.01 at. % inclusive to 15 at. % inclusive.

8. A semiconductor device comprising a silicon substrate, gate dielectric films formed on a major surface of said silicon substrate, gate electrode films formed on said gate dielectric films, and wiring films for contact formed on said major surface of said silicon substrate, said wiring firms being mostly composed of cobalt silicide or nickel silicide, said major surface being formed so as to be (111) crystal face of the substrate, wherein the substrate having (111) orientation is used to prevent diffusion of cobalt from the wiring films into the substrate, wherein said gate dielectric films contain titanium in a concentration of from 0.005 at. % inclusive to 15 at. % inclusive.

* * * * *